(12) United States Patent
Robinson

(10) Patent No.: US 7,315,442 B2
(45) Date of Patent: Jan. 1, 2008

(54) SECURE ELECTRICAL SERVICE ENTRANCE POWER ACCESS

(75) Inventor: Darrell Robinson, Highland, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 308 days.

(21) Appl. No.: 10/966,602

(22) Filed: Oct. 15, 2004

(65) Prior Publication Data
US 2006/0082955 A1    Apr. 20, 2006

(51) Int. Cl.
H02B 1/00       (2006.01)
H01R 33/945  (2006.01)

(52) U.S. Cl. .................. 361/659; 361/664; 361/668; 361/672; 324/156; 439/517

(58) Field of Classification Search ........ 361/659–672; 324/156; 439/517
See application file for complete search history.

(56) References Cited

U.S. PATENT DOCUMENTS

| | | | |
|---|---|---|---|
| 4,900,068 A | 2/1990 | Law | ............................ 285/161 |
| 4,977,482 A | 12/1990 | Langdon et al. | |
| 5,216,802 A | 6/1993 | Cole et al. | |
| 5,268,850 A | 12/1993 | Skoglund | |
| 5,672,823 A | 9/1997 | Lachmann et al. | |
| 6,074,246 A | 6/2000 | Seefedt et al. | |
| 6,200,158 B1 | 3/2001 | Robinson | |
| 6,663,422 B1 | 12/2003 | Robinson | |
| 7,040,920 B2 | 5/2006 | Johnson, Jr. et al. | |
| 2005/0164546 A1* | 7/2005 | Johnson et al. | ............. 439/517 |

OTHER PUBLICATIONS

Ekstrom Ind., Inc.; LP-4J-G2-SP4228 Socket Adapter with Heyco Strain Relief Bushing, Published May 14, 2002.
Ekstrom Ind., Inc.; 37-4JHR-SP116 and 37-4JHR-G2-SP116, Published Jul. 1, 1981.
Ekstrom Ind., Inc.; 37-4JHR-G2-SP1470 Socket Adapter; Published Nov. 2, 2003.
Ekstrom Ind., Inc.; Temporary Service Adapters 700 Series; Published 1996.
Underwriters Laboratories, Inc.; UL StandardsInfoNet; Class 2 Power Units UL1310; Dated Apr. 14, 2004.
ATC-Frost; ATC-frost.com; CA Series, Energy Limiting Transformers; Dated Apr. 4, 2004.

* cited by examiner

Primary Examiner—Gregory D Thompson
(74) Attorney, Agent, or Firm—Young Basile Hanlon MacFarlane & Helmholdt

(57) ABSTRACT

An external wire coupler is attachable to a housing of an electrical service apparatus mountable in a watthour meter socket by a slide-in or snap-in connection. An access control member is carried within the coupler for controlling access through the coupler to the interior of the socket adapter. A cover may be releasibly attached to an open end of the coupler to close access to the interior of the coupler.

20 Claims, 16 Drawing Sheets

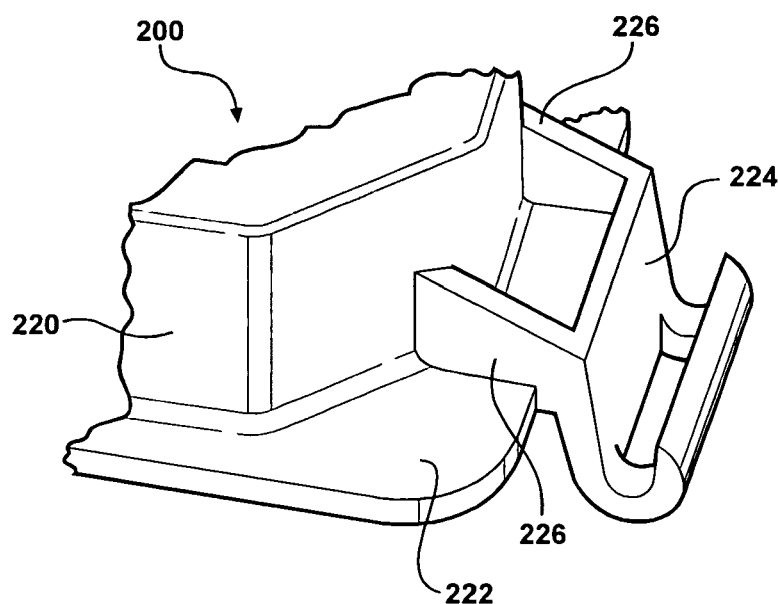
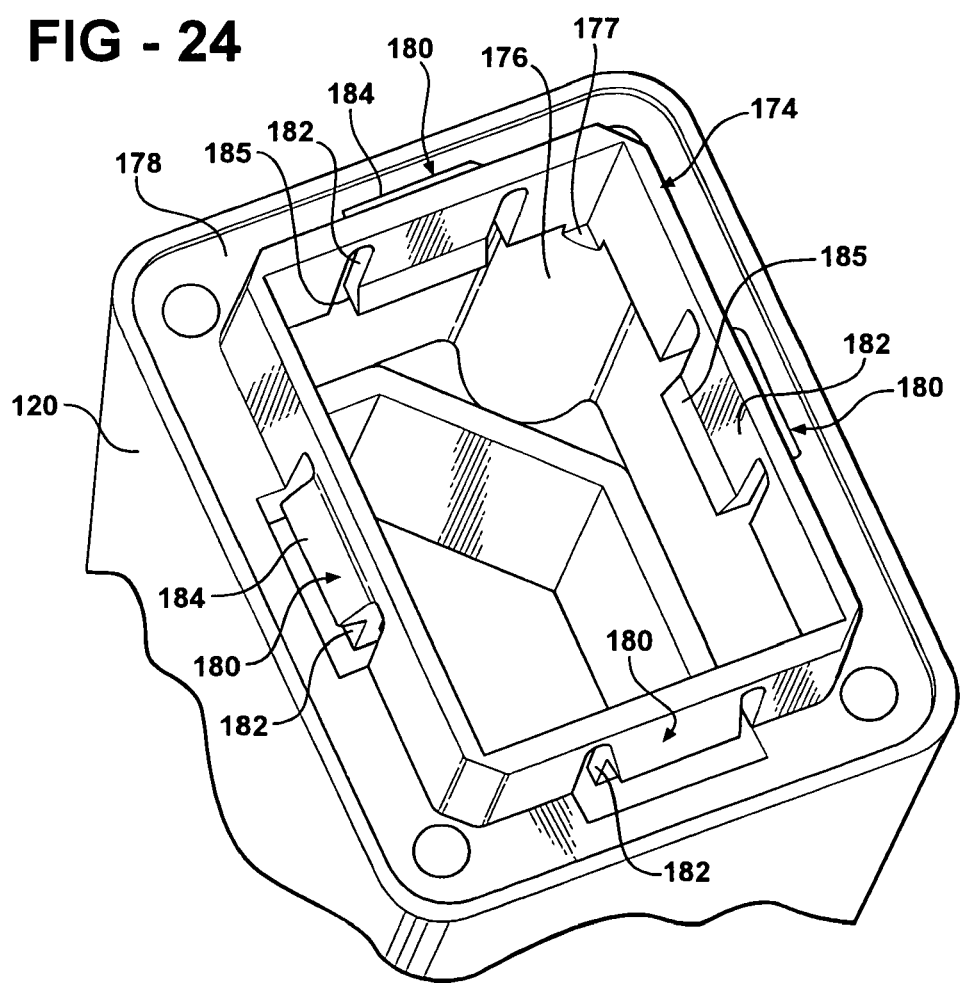

SECURE ELECTRICAL SERVICE ENTRANCE POWER ACCESS

BACKGROUND

Portable or stand alone generators are used to supply power in the event of discontinuation of the main electrical service to a building or residence. Typically, a plug on the end of a conductor extending from the generator is connected to an outlet mounted in the building. The outlet is wired to a transfer switch which is itself wired to individual circuits in the building power distribution network. A hard wire connection from a generator directly to the transfer switch contains movable switches which allow power from the generator to be applied to selected building circuits.

It has been proposed to connect the generator output to a watthour meter socket which is already wired to the power distribution network through a circuit breaker.

A watthour meter socket includes a single phase or a polyphase arrangement of jaw contacts which receive a watthour meter, typically in a plug-in connection. It is known to utilize watthour meter socket adapters to convert older style bottom connected watthour meter sockets to receive plug-in watthour meters. Such socket adapters include a base carrying the jaw contacts and outwardly extending blade terminals which are insertable into the jaw contacts in the meter socket. The jaw contacts in the adapter receive the blade terminals of a watthour meter in a plug-in connection. A sidewall or shell is formed on or connected to the base and extends through or up to the socket cover allowing at least the dome portion of the watthour meter to extend through the socket cover aperture in a ringless socket or the entire meter to be coupled to the socket cover in a ring style socket cover connection.

It is known to provide watthour meter socket adapters with couplers or housings for receiving external plugs or wire connections. Such housings or couplers have been attached to the sidewall or shell of the socket adapter by fasteners, a threaded connection, or an unlatched slide-in mount.

It would be desirable to provide a secure electrical service entrance power access which provides an easy, economical secure access to existing socket connections to a meter socket through a socket adapter. It would also be desirable to provide such a service entrance power access which is easily adaptable to different electrical connections. It would also be desirable to provide an approved electrical service entrance access.

SUMMARY

The present invention is a secure electrical service entrance power access apparatus which provides an economic and simple connection for external conductors to contacts in a watthour meter socket adapter.

In one aspect, the apparatus includes a housing. Connecting means are mounted in the housing for power connection to a watthour meter service socket. A power limiting Class 2 or Class 3 transformer may be mounted in the housing and connected to the connecting means of contacts to provide low voltage power. Secondary conductors from the transformer may exit the housing without requiring an external conduit.

Ventilation apertures are formed in a sidewall of the housing. In one aspect, the ventilation apertures are disposed in between spaced ribs formed on the shell of the housing which are adapted for mounting circuit boards within the housing.

A coupler is releasably mounted on the housing to establish a path for external conductors to the interior of the housing. In one aspect, means are provided for a slide-in latchable attachment of the coupler to the housing. An access control plate may be mounted in the coupler for controlling access through the coupler to the housing. Latch means may be mounted on the coupler and releasably engagable with a surface on the housing to latch the coupler to the housing. In this aspect, the coupler slides into a discontinuity formed on the sidewall or shell of the housing.

In another aspect, the coupler is snap connected through an aperture in the shell of the housing. An access control plate is also carried in this coupler for controlling access through the coupler to the interior of the housing.

A cover may be movably attached to the coupler to selectably close an open end of the coupler. The cover may be hinged at one end to the coupler and snap connected by hook-like connections at another end to the coupler.

The present apparatus provides an easy and economical secure access to an existing connection to a meter socket through a watthour meter socket adapter. The apparatus is easily connectable to a socket adapter and is adaptable to different external connections.

BRIEF DESCRIPTION OF THE DRAWING

The various features, advantages and other uses of the present invention will become more apparent by referring to the following detailed description and drawing in which:

FIG. 23 is an enlarged, perspective view of the coupler cover hinge connection;

FIG. 24 is a top perspective view showing the interior of the coupler shown in FIGS. 14 and 15;

DETAILED DESCRIPTION

Figure 1:
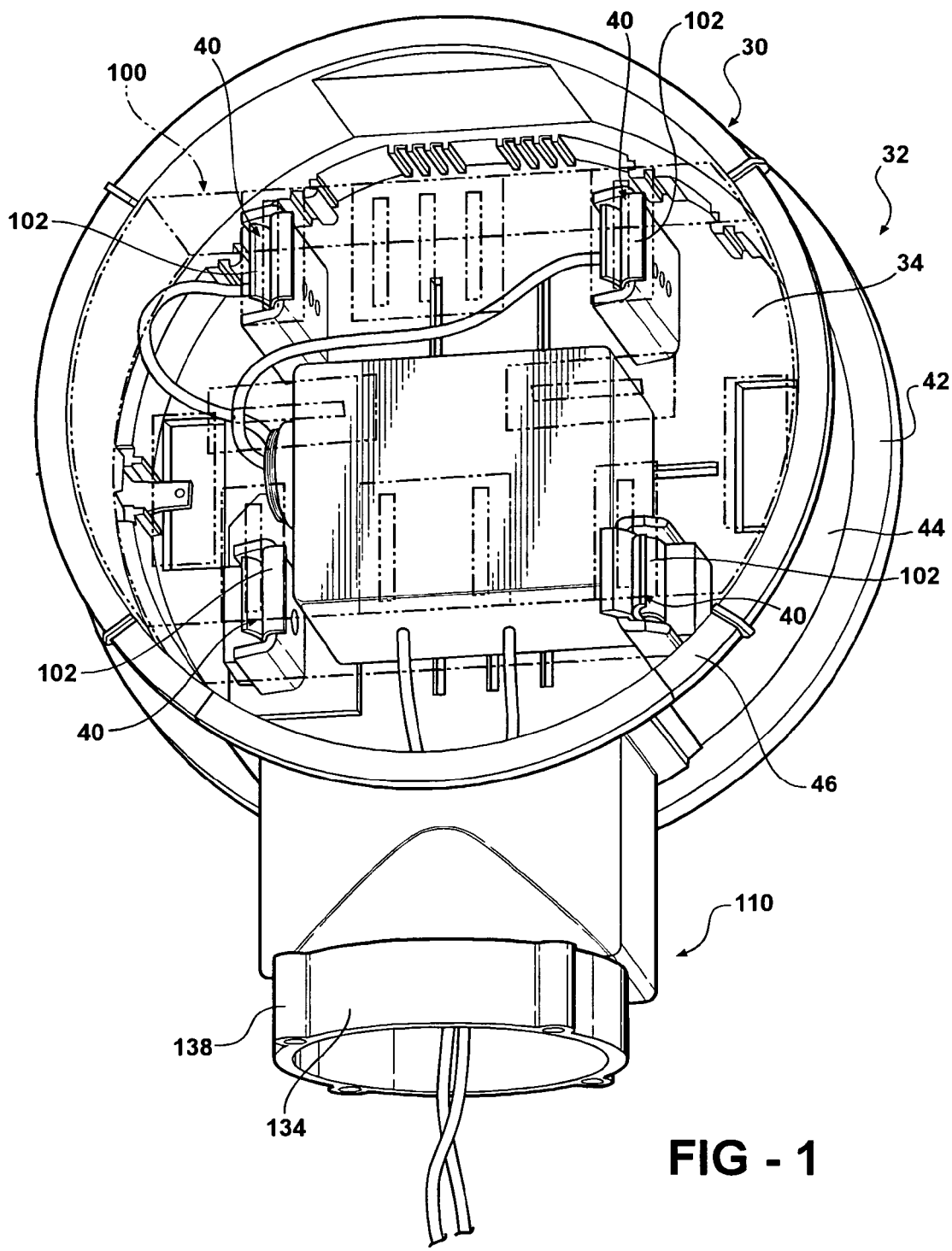
FIG. 1 is a perspective view of one aspect of an electrical service entrance power access with a jaw contact shield shown in phantom.

Referring now to the drawing, and to FIGS. 1-8 and 27 in particular, there is depicted a socket adapter 30 which may be used as part of a secure electrical service power access apparatus 32.

By way of background only, the socket adapter 30, which may be constructed in the same manner as the socket adapter shown in U.S. Pat. No. 6,325,666, includes a base 34 having generally planar configuration. A plurality of slots 36 are formed in the base 34 to receive the blade terminal portion of jaw blades 40, shown in FIGS. 1 and 2. The rear surface of the base 34, as shown in FIG. 3, may include a plurality of spaced pairs of bosses, such as boss pair 38 which receives and provides support for the through extending blade terminal 39 of the jaw blade 40.

Figure 7:
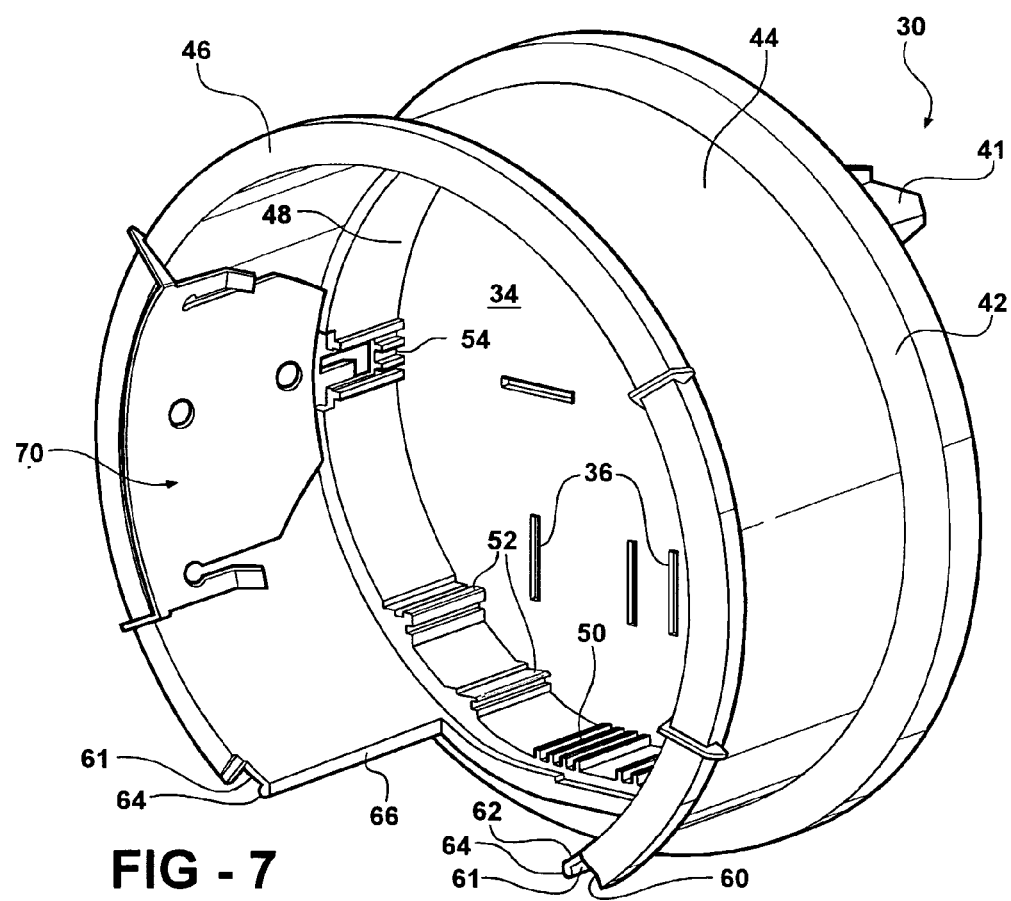
FIG. 7 is a perspective view of the socket adapter used in the first aspect of the power access.

The base 34 terminates in a radially outward, generally circular first mounting rim 42 as shown in FIG. 7. An annular sidewall or shell 44 projects from the base 34 and the rim 42 to a second radially outward extending mounting rim 46. In a ringless style socket connection, the first mounting rim 42 mates with a socket cover, not shown. The second mounting rim 46 is configured for mating with a mounting rim on a watthour meter socket in a ring-style socket. An inner, generally annular collar 48 may be formed internally of the sidewall 44 and extending from the periphery of the base 34.

Figure 2:
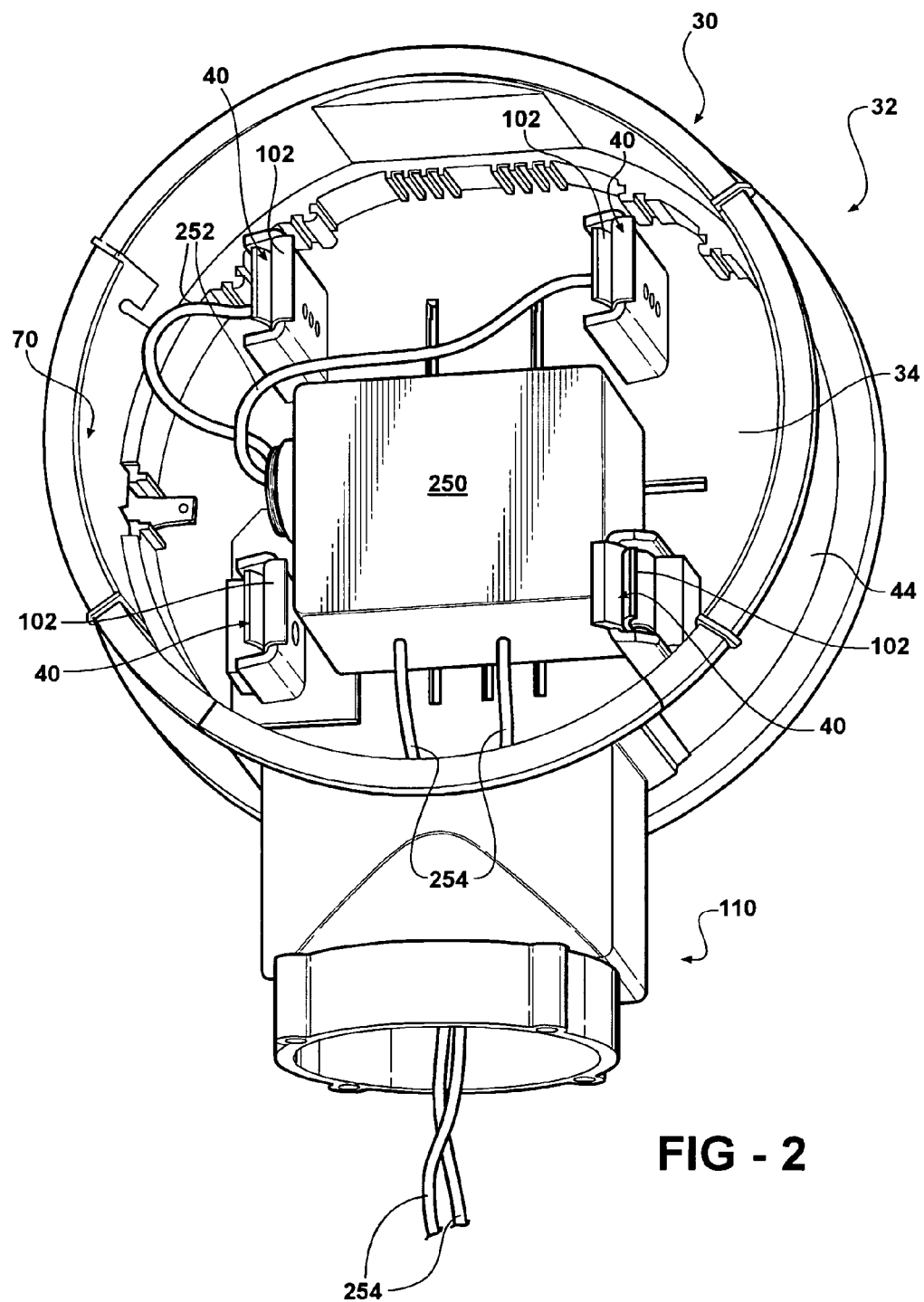
FIG. 2 is a perspective view of the power access shown in FIG. 1, but with the shield removed.
Figure 3:
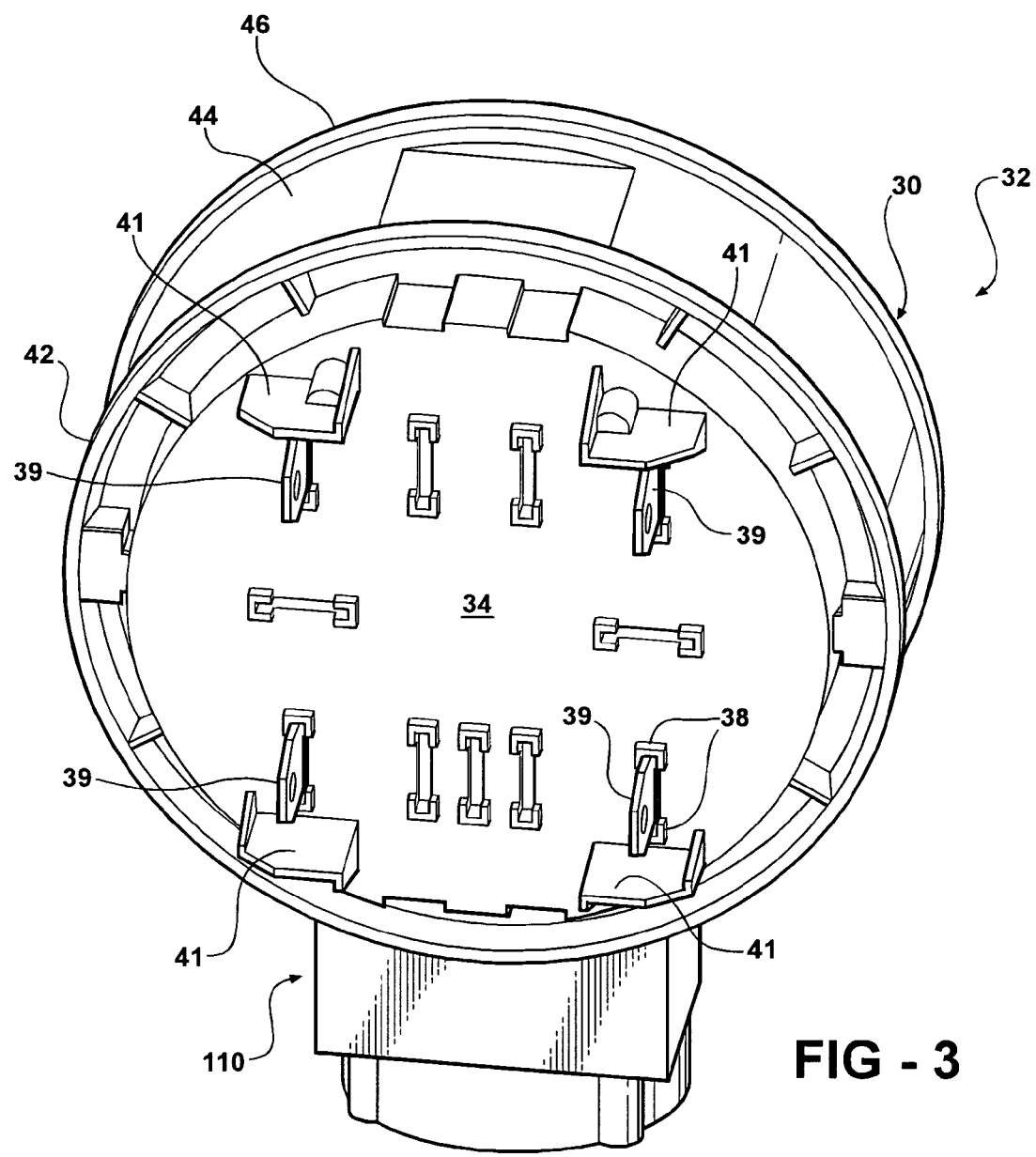
FIG. 3 is a rear perspective view of the power access shown in FIGS. 1 and 2.
Figure 4:
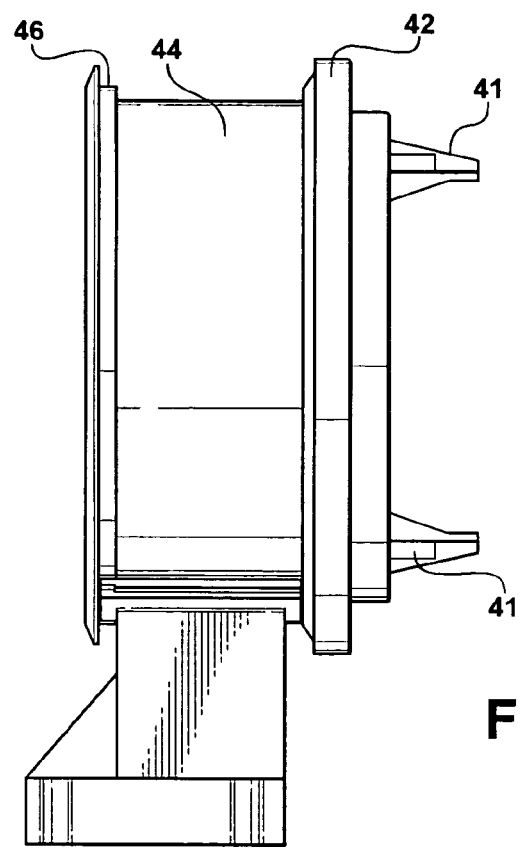
FIG. 4 is a side elevational view of the power access shown in FIGS. 1-3.

As shown in FIGS. 1, 2 and 7, a plurality of spaced ribs 50, 52 53, etc., are formed in one or more locations in the collar 48 on the inside of the sidewall 44. The ribs 50, 52, 53, etc., are spaced apart to define slots typically used for mounting circuit boards and other components within the interior of the socket adapter 30. As shown in detail in FIG. 8, the ribs 50, 52, 53, etc., in one portion of the collar 48 are spaced apart by slots, the bottom ends of which are formed as vent apertures 54 which extend completely through the collar 48 and the sidewall 44 and open exteriorly of the sidewall 44.

Figure 8:
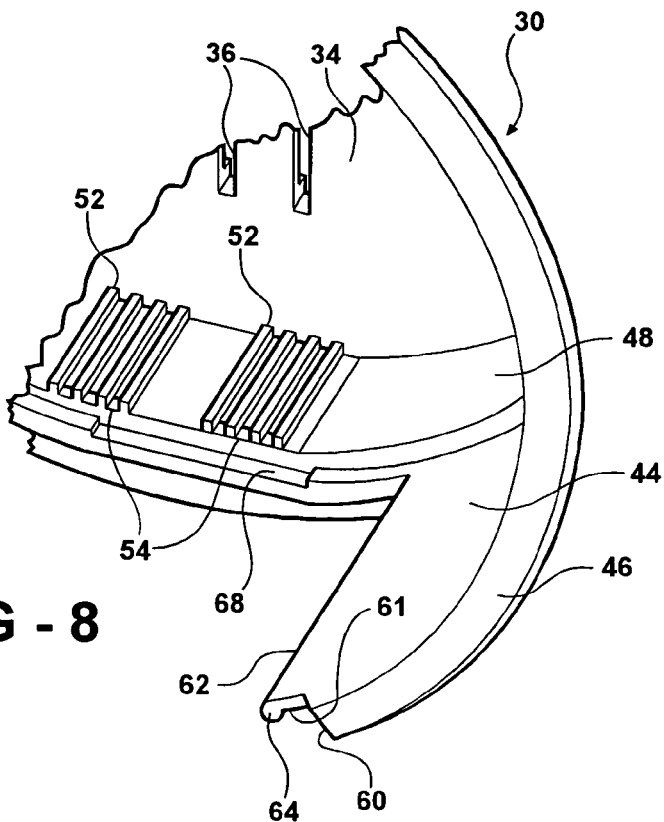
FIG. 8 is a partial, enlarged, perspective view showing vent openings and coupler attachment features.

As shown in FIGS. 7 and 8, a discontinuity 60 formed by an opening through the second mounting rim 46 and the sidewall 44 is formed in one portion of the socket adapter 30, such as at a lower portion of the socket adapter 30 when the socket adapter 30 is in a normal mounting position in a meter socket, for example.

The discontinuity 60 forms a notch 61 in the sidewall 44 in which an inner edge 62 of the sidewall 44 forming one edge of a notch 61 has an enlarged, generally spherical shaped projection or bead 64. A similar projection 64 is formed on the opposed edge 66 of the discontinuity 60.

The bottom edge of the discontinuity 60 includes a notch or recess 68 in the sidewall 44 generally adjacent to the portion of the annular collar 48 containing one group of vent apertures 54.

Figure 6:
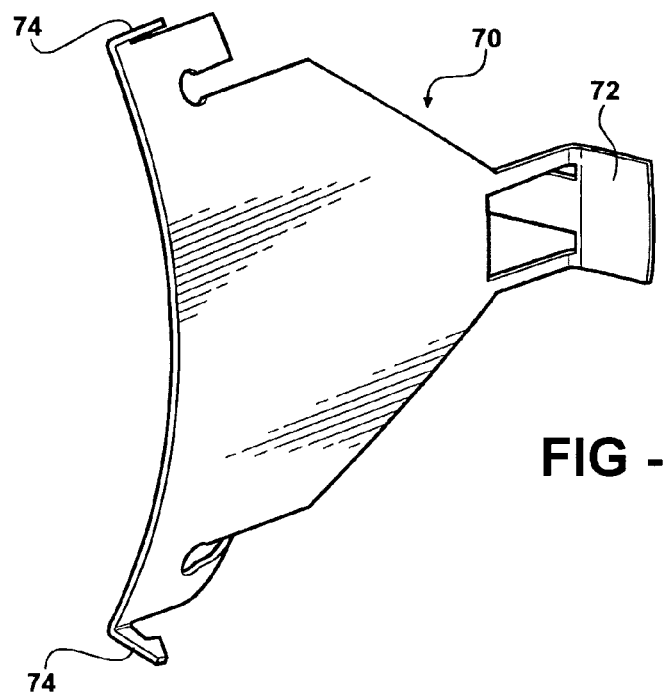
FIG. 6 is a perspective view of one of the surge ground straps shown in FIGS. 1 and 2.

As shown in FIGS. 1 and 2, and in greater detail in FIG. 6, a pair of surge ground straps 70 are mounted on a second mounting rim 46 and extend along the interior surface of the sidewall 44 to a lower bendable edge 72. Arms 74 on the upper end of the surge ground strap 70 seat within apertures formed in the second mounting rim 46 to support the surge ground strap 70 immediately adjacent the inner surface of the sidewall 44. One end of the opposed bendable end 72 is extendable through an aperture in the sidewall 44 generally adjacent to the bottom most surface of the mounting flange 42 to secure the surge ground strap 70 on the socket adapter 30 as well as providing a contact or connection point to a ground connection in the meter socket.

A plurality of mounting feet 41, shown in FIG. 3, are formed on the back surface of the base 34 generally adjacent each blade terminal 40 to protect each blade terminal 40 as well as to support the socket adapter 30 on a meter socket.

Figure 5:
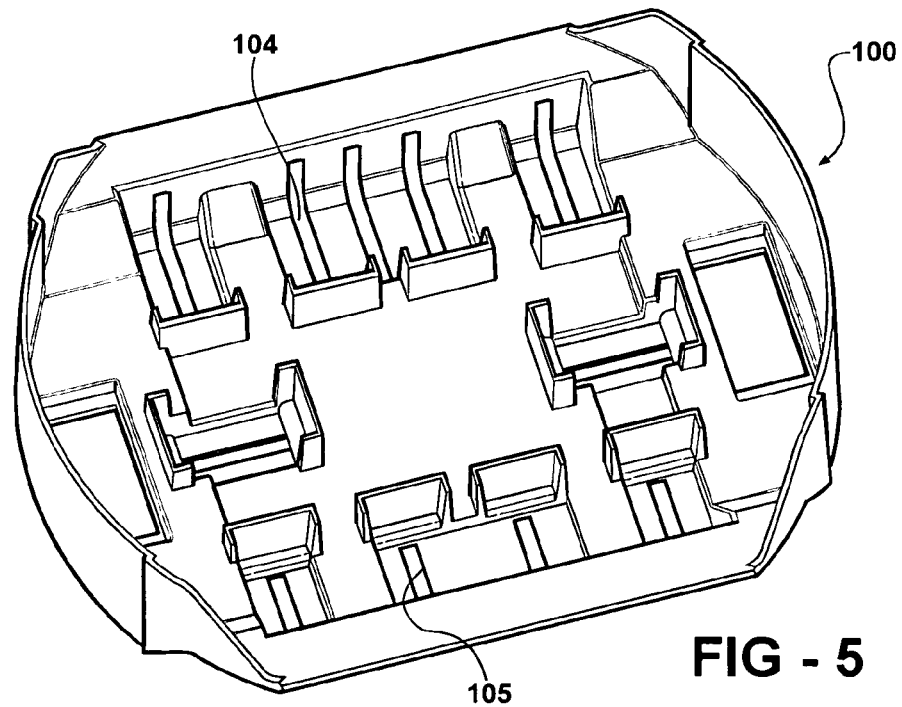
FIG. 5 is a rear perspective view of the jaw contact shield shown in FIG. 1.

A safety shield 100, shown in FIG. 1 and in greater detail in FIG. 5, may optionally be provided over the jaw contacts 102 mounted in the base 34. The jaw blades 40 may take any shape, such as the jaw blades described in U.S. Pat. No. 6,663,422. The safety shield 100, which may take any one of a variety of shapes, as described in U.S. Pat. No. 6,325,666, the contents of which is incorporated herein by reference, generally includes a plurality of apertures 104, shown in FIG. 5, which provide access to the underlying jaw contacts 102 of the jaw blades 40 to enable a blade terminal of the watthour meter, not shown, to be inserted therethrough into mating engagement with the jaw contacts 102. The safety shield 100 encompasses or provides a barrier around at least the outmost end of the jaw contacts 102 to prevent inadvertent contact with the jaw contacts. The safety shield 100 is mountable in the socket adapter 32 by fasteners, snap in connections, etc., as described in the above-referenced patent.

Referring now to FIGS. 1-4, and to FIGS. 9-13 in particular, a power access coupler 110, has a slide in attachment to the socket adapter 30. By way of example only, the coupler 110, which may be formed of an electrically insulating plastic, has a one-piece, unitary body of a molded plastic.

Figure 9:
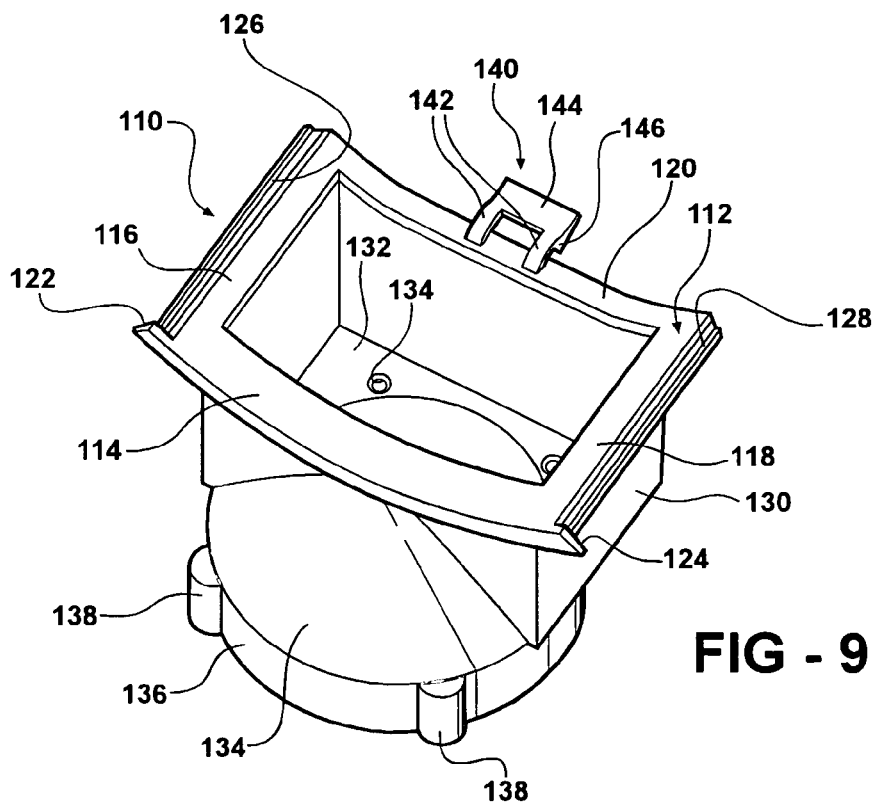
FIG. 9 is a top perspective view of one aspect of the coupler shown in FIGS. 1 and 2.

The coupler 110 includes a rim 112 having any cross sectional shape, with the polygonal or four sided shape shown in FIG. 9 being depicted by way of example only. Thus, in the present aspect, the rim 112 is formed of four side edges including a front edge 114, opposed side edges 116 and 118 and a back edge 120. The terms "front, back and side" are taken with respect to the mounting position of the coupler 110 in the socket adapter 30 when the socket adapter 30 is in its normal mounting position in a meter socket.

The front edge 114 includes outer end flanges 122 and 124 which are sized and shaped to overlay the notches 61 formed in the second mounting rim 46 when the coupler 110 is mounted in the socket adapter 30. The overlay of the outer end flanges 122 and 124 of the front edge 114 of the coupler 110 in the notches 61 in the discontinuity 60 in the second mounting rim 46 strengthens the interlock between the coupler 110 and the socket adapter 30.

The opposed side edges 116 and 118 and, optionally, the back edge 120 include slots or recessed grooves 126, 128 and 129, respectively. The grooves 126, 128, and 129 may be formed in a single thick side edge 116, 118 or rear edge 120 or formed by two spaced side edges 116, two spaced side edges 118, and two spaced back edges 120.

The grooves 126 and 128 are sized and shaped to receive the enlarged bead 64 formed on the inner side edges 62 and 66 of the discontinuity 60 in the sidewall 44 of the socket adapter 30. This provides a slide in connection between the side edges 116 and 118 of the coupler 110 and the sidewall 44 enabling the coupler 110 to be slidably mounted in the discontinuity 60 in the sidewall 44. At the same time, the position of the beads 64 in the grooves 126 and 128 of the coupler 110 causes the bead 64 to lock in the grooves 126 and 128 upon the application of a downward force on the coupler 110 tending to separate the coupler 110 from the sidewall 44 of the socket adapter 30. This interlocking of the beads 64 in the grooves 126 and 128 increases the pull-out force resistance which maintains the coupler 110 in the socket adapter 30.

The coupler 110 includes a housing 130 of generally polygonal shape depending from the rim 112. The housing 130 is hollow and opens to an open end in the rim 112 and depends therefrom to an inner wall 132. One or more bores 133 are formed in the wall 132 for attaching a cover, access control plate, etc., to the coupler 110, as described hereafter.

From the wall 132, the housing 130 flares outward in a generally conically-shaped portion 134. By example only, the conical portion 134 has a circular cross section at a lower end. The conical portion 134 transitions into a collar 136 having, by example only, an annular shape. One or more optional bosses 138 are formed on the collar 136. Each of the bosses 138 has an opened ended bore for receiving fasteners to mount covers or other attachments to the coupler 110.

Figure 25:
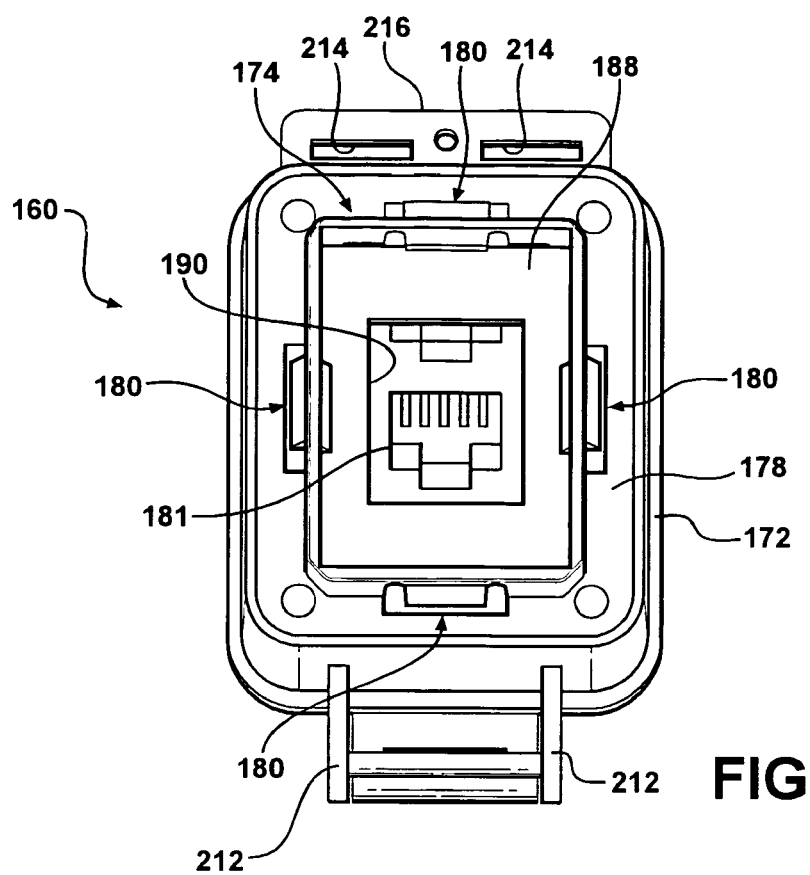
FIG. 25 is a plan view of the coupler shown in FIG. 24, with an access control member mounted therein.
Figure 26:
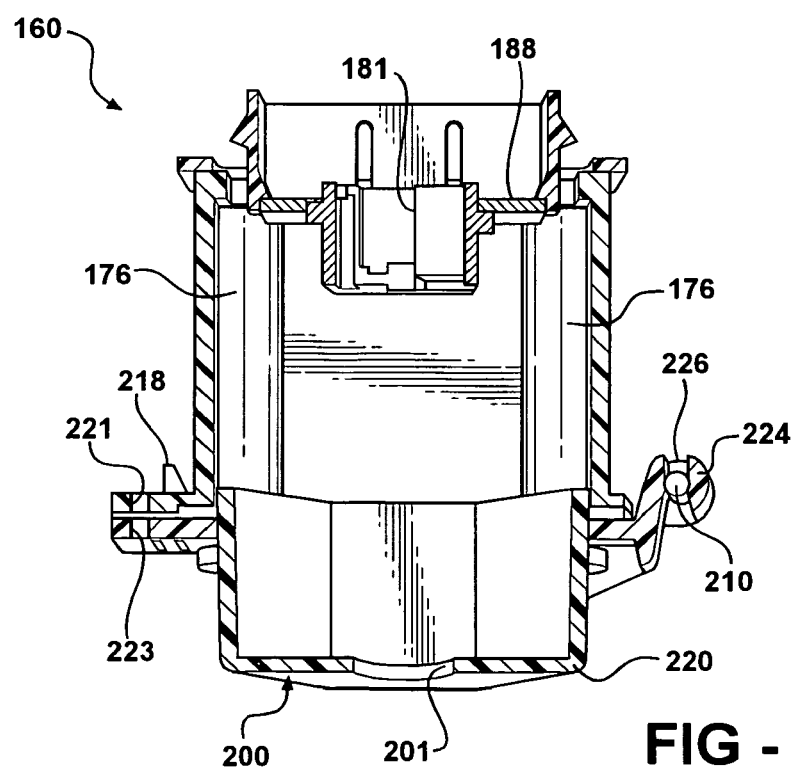
FIG. 26 is a perspective, cross sectional view of the coupler shown in FIGS. 14-25.

The inner wall 132 forms a seat for receiving a plate which can carry a security access control, fuses, printed circuit board, plug socket, etc., as shown in FIGS. 25 and 26 and described hereafter. The plate, not shown in FIG. 9, can be fixed to the wall 134 by fasteners mountable through the plate and into the bores 133.

Figure 10:
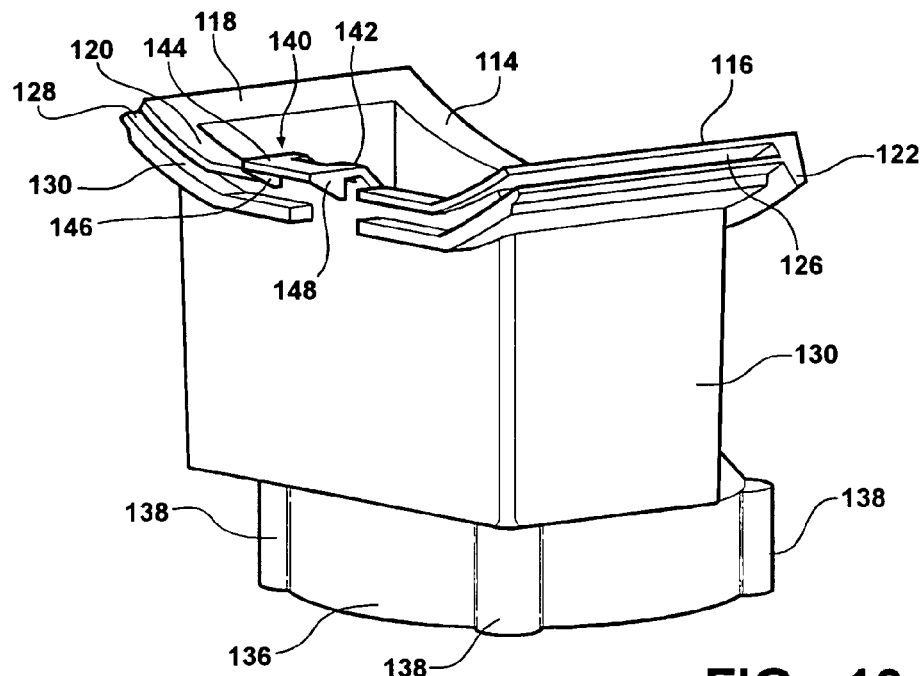
FIG. 10 is a side perspective view of the coupler shown in FIG. 9.
Figure 11:
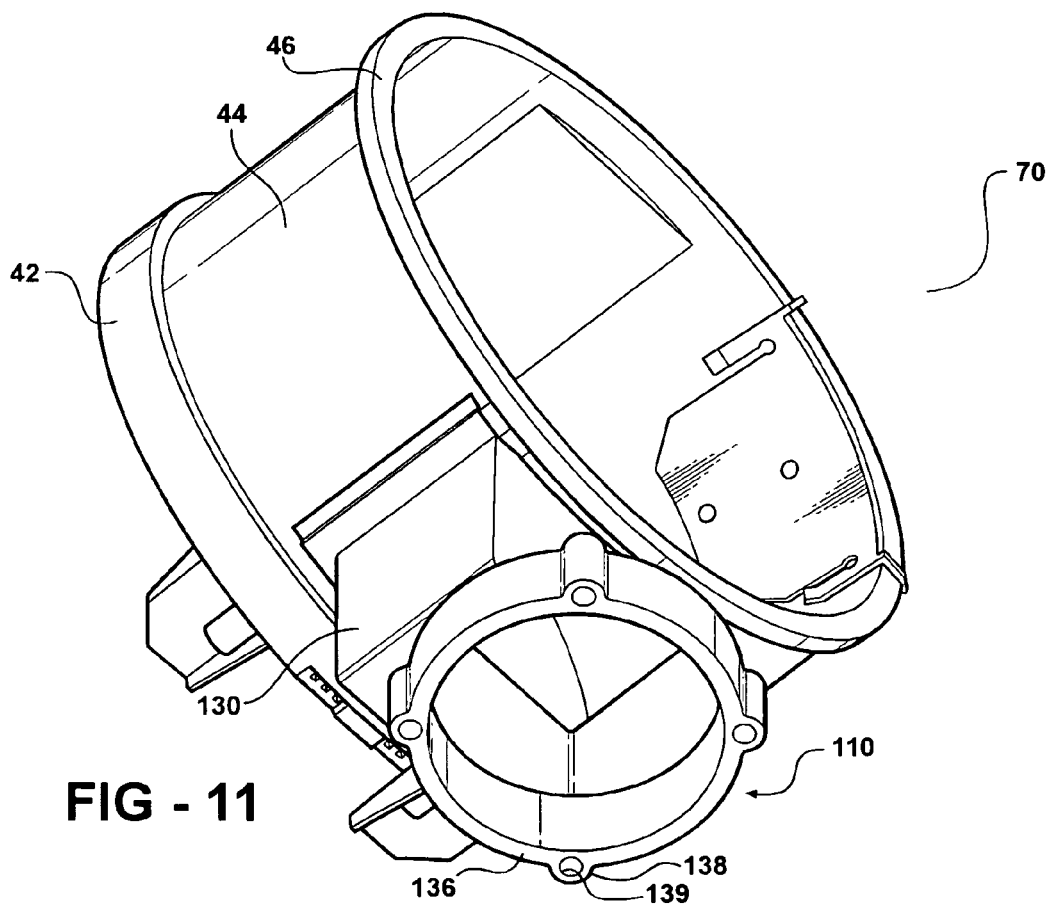
FIG. 11 is a bottom perspective view showing the coupler of FIGS. 9 and 10 mounted on the socket adapter of FIG. 1.
Figure 12:
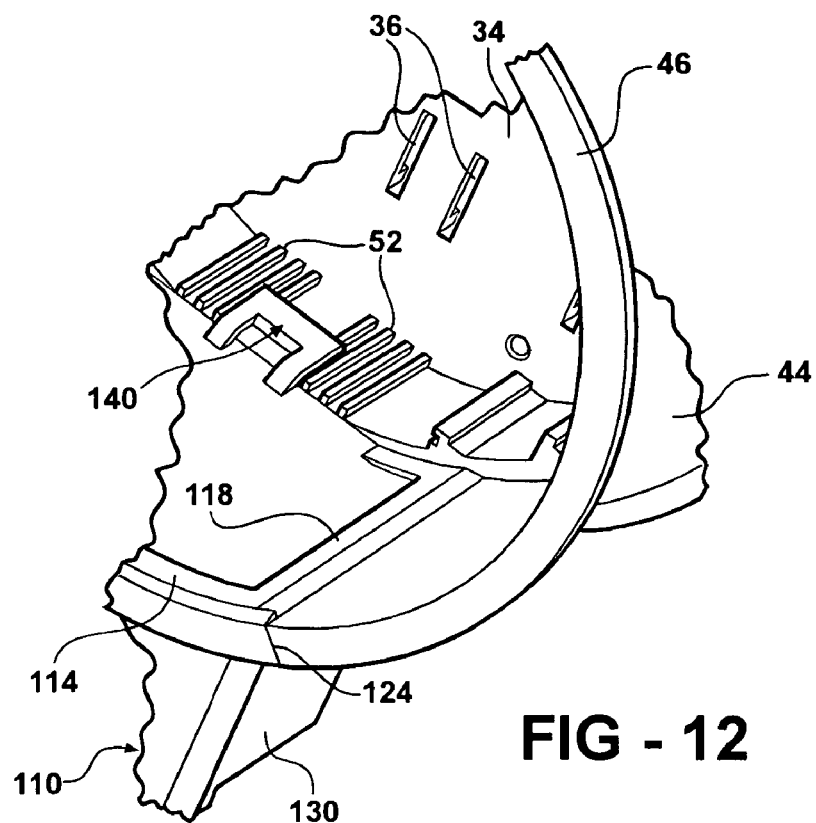
FIG. 12 is a partial perspective view showing the mounting of the power access to the coupler connections shown in FIG. 7.
Figure 13:
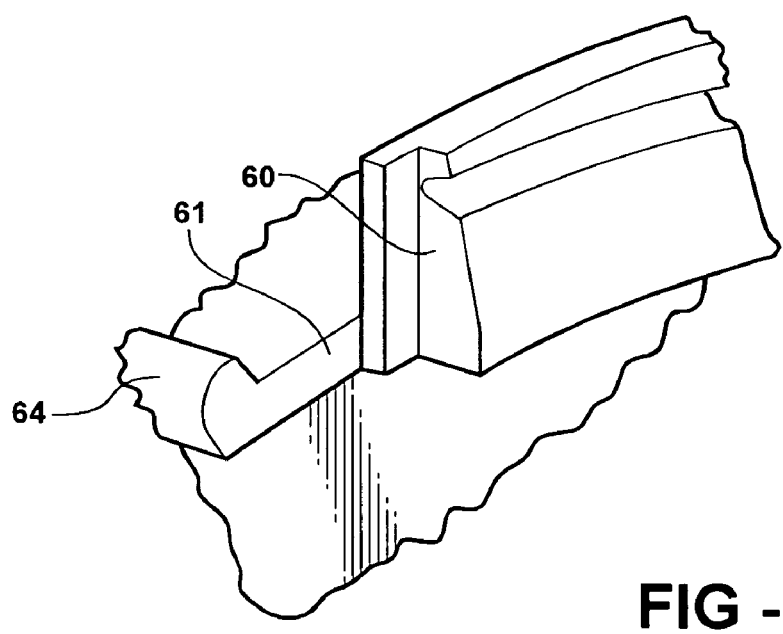
FIG. 13 is a bottom perspective view showing the coupler to the socket adapter connection.

As shown in FIGS. 9, 10 and 12, the coupler 110 includes a latch 140 carried, by example, on the back edge 120. The latch 140 includes one or more legs 142 fixed or unitarily molded with the back edge 120 of the rim 112. The legs 142 transition into an end wall 144. At least one or two latch members or hooks 146 and 148 depend from the end wall 144. The hooks 144 and 146 slide into and engage an edge of the one of the vent apertures 54 on the collar 48 of the shell 44 to releasably latch the coupler 110 to the socket adapter 30. In this manner, separation of the coupler 110 from the socket adapter 30 can be accomplished only from the interior of the socket adapter 30 after the meter has been removed.

Referring now to FIGS. 14-25, there is depicted another aspect of a coupler 160. The coupler 160 is mountable in a socket adapter 162 which is similarly constructed as the socket adapter 30 described above and shown in FIG. 1.

Figure 14:
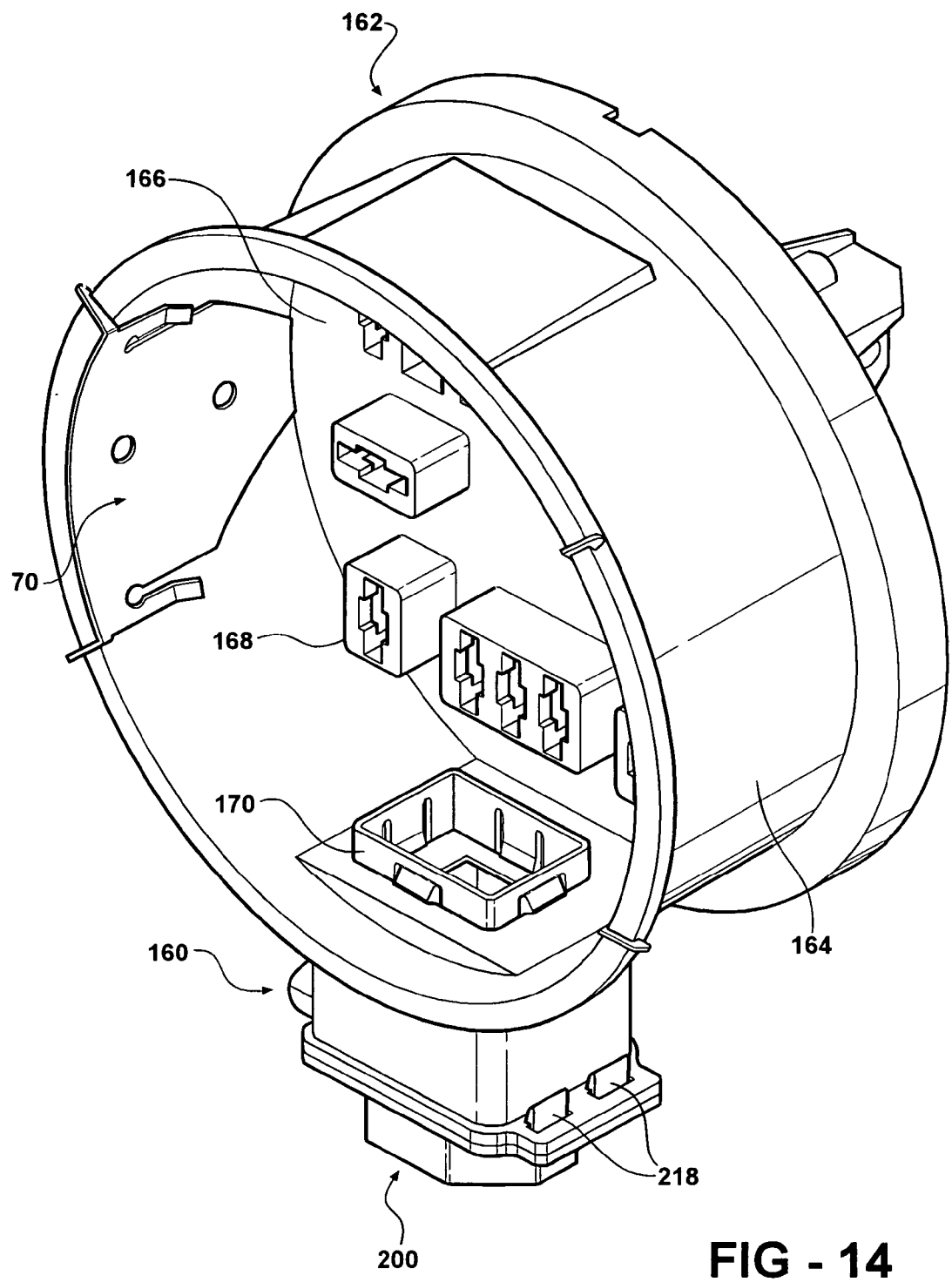
FIG. 14 is a perspective view of another aspect of a power access according to the present invention.
Figure 16:
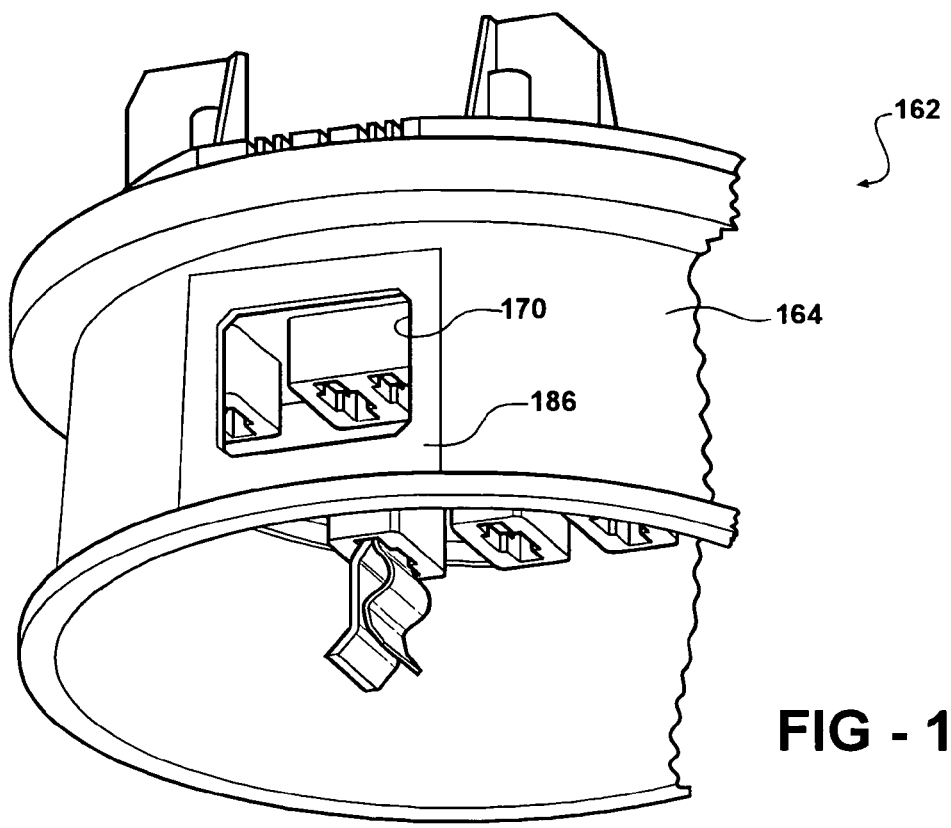
FIG. 16 is a perspective view of the socket adapter used in the power access of FIGS. 14 and 15, with the coupler removed.
Figure 17:
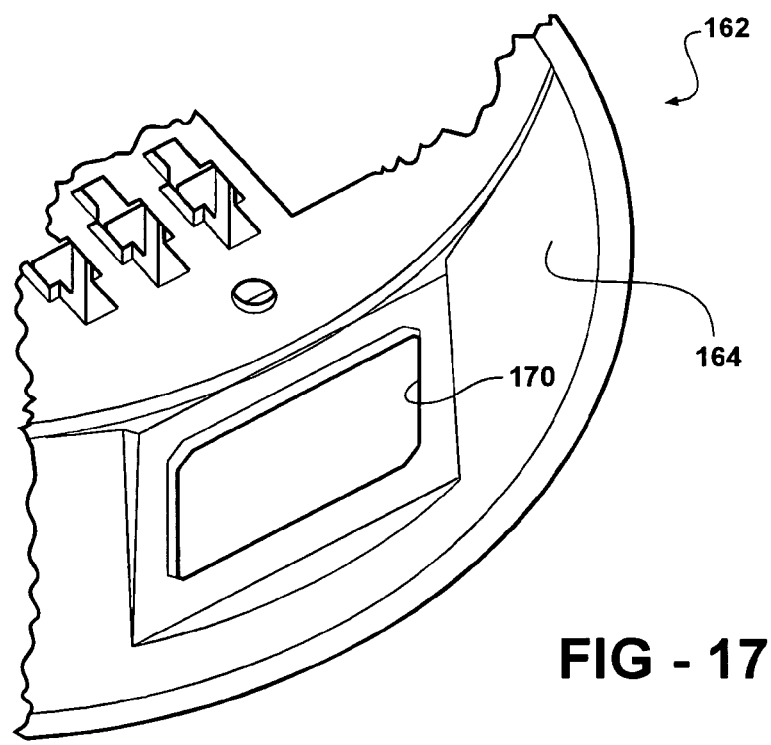
FIG. 17 is a partial, perspective view showing the interior of the socket adapter depicted in FIG. 16.

By example only, the socket adapter 162 includes a sidewall 164 extending from a base wall 166. Bosses 168 are formed by example on the base wall 166 for receiving and supporting jaw blades, not shown. As shown in FIGS. 14, 16, and 17, an aperture 170, of any shape, such as the polygonal shape which is shown by way of example only, is formed in the sidewall 164. The aperture 170 has a shape complementary to the shape of a mounting end of the coupler 160.

As shown in greater detail in FIGS. 18-25, the coupler 160 includes a housing or body 172 formed with a hollow interior. A mounting collar 174 having a cross section complementary to the cross section of the aperture 170 in the sidewall 164 of the socket adapter 162 is formed with four end-to-end joined walls. Four bosses 176 are formed at the inner junction of the walls of the mounting collar 174, with an edge 177 generally located in the same plane as an end wall 178 of the housing 172.

Latch means in the form of one or more latch members 180 are formed on the housing 172. The latch members 180, by example only, constitute four latch members, each carried on one of the walls of the mounting collar 174. The latch members 180 each include a stem 182 extending integrally from the mounting collar 174 and an enlarged hook shaped end projection 184. Each latch member 180 is movably mounted in an aperture in the mounting collar 174 such that upon insertion of the mounting collar 174 through the aperture 170 in the sidewall 164 of the socket adapter 162, the hook shaped projections 184 cause each stem 182 to bend inward allowing the hook shaped projections 184 to pass through the edges surrounding the aperture 170 and then snap back over the edges of the apertures 170 after the mounting collar 174 has been inserted fully through the aperture 170. In this position, the latch members 180 fix the coupler 160 to the sidewall 164. Also in this position, the end wall 178 or an adjacent edge 186 of the housing 172 abuts an outer flat 186 formed on the sidewall 164 of the socket adapter 162. In this manner, the coupler 160 is configured for snap-on mounting to the socket adapter 162.

Figure 18:
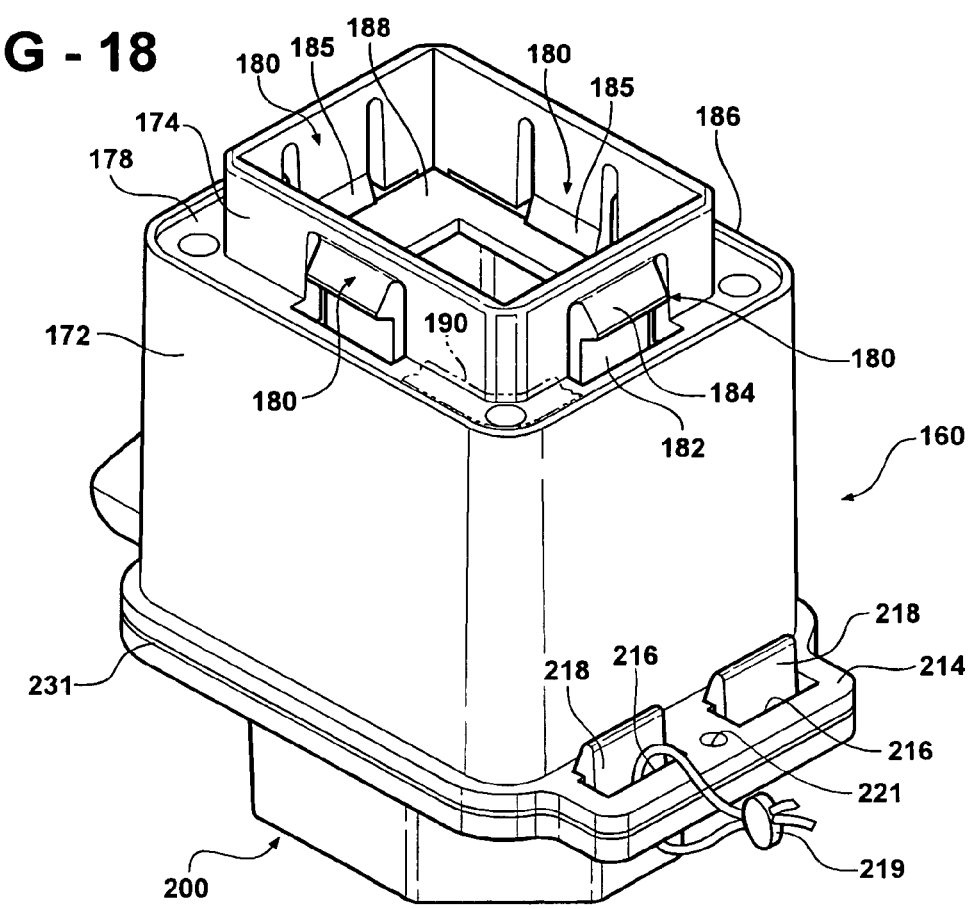
FIG. 18 is a perspective view another aspect of the coupler shown in FIG. 14.
Figure 20:
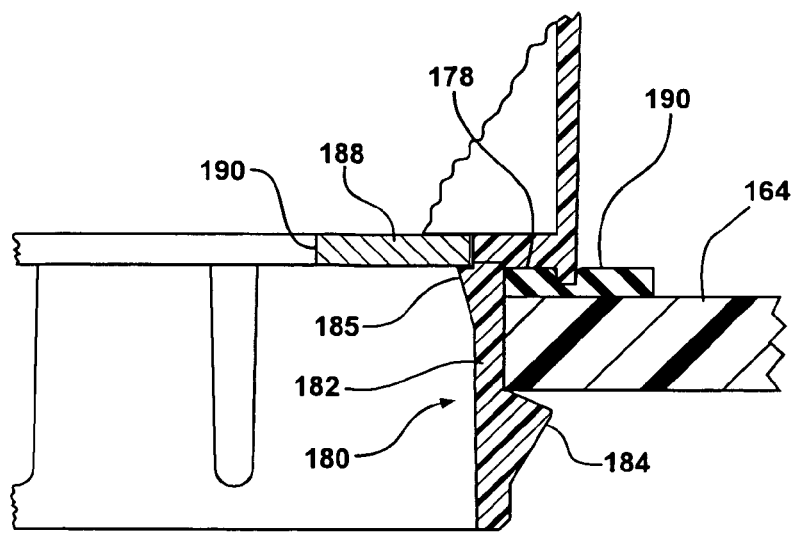
FIG. 20 is a side elevational view, partially cross sectioned, showing the coupler to socket adapter shell connection.
Figure 21:
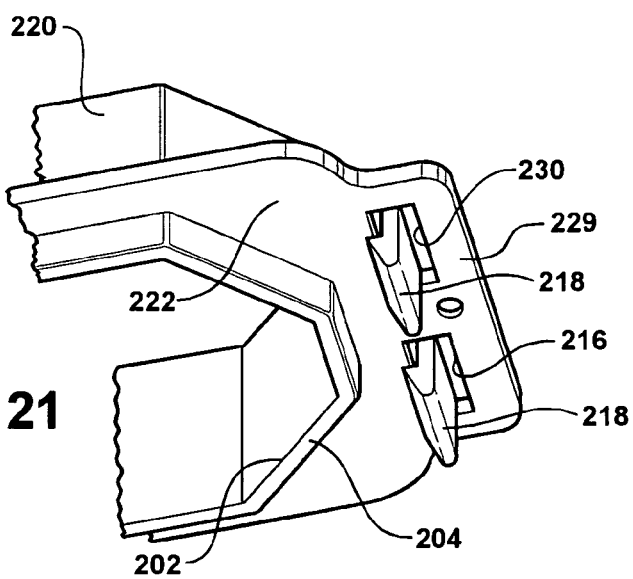
FIG. 21 is a partial, inverted, perspective view showing a portion of the cover.

The stems 182 of each of the latch members 180 also includes a second projection 185 which extends from an opposite end of each stem 182 and is disposed within the interior of the mounting flange 174 as shown in FIGS. 18, 20 and 24, for example.

Figure 19:
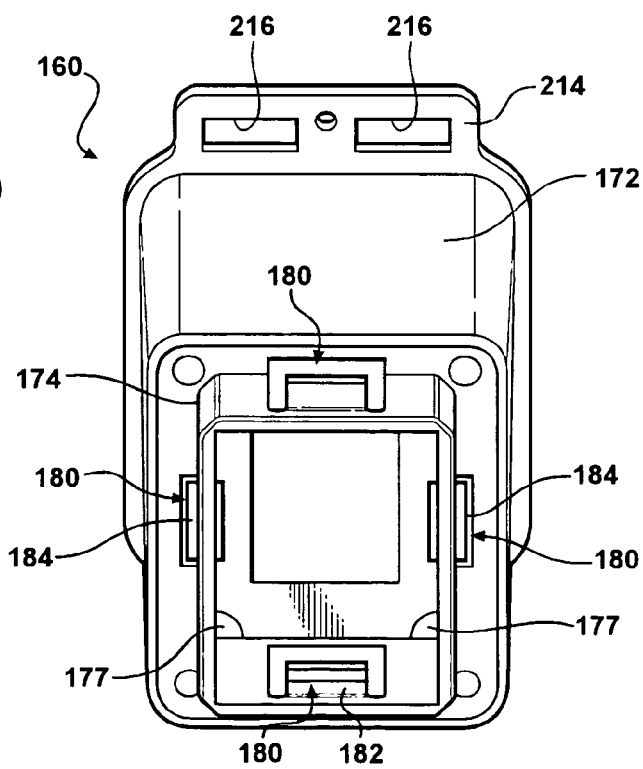
FIG. 19 is a bottom perspective view of the coupler shown in FIG. 18.

As shown in FIGS. 19 and 24, the inner bosses 176 in the housing 172 form a seat on which a security or access control plate 188, shown in FIGS. 18, 25 and 26, may be mounted in the interior of the housing 172. An optional aperture 190 formed in the wall 176 may be used to pass conductors, plugs or other components from the interior of the housing 172 to the interior of the socket adapter 162. Alternately, the plate 188 may be solid to block access between the interior of the coupler 160 and the interior of the socket adapter 162. The projections 185 can bend outward with respect to the mounting flange 174 to enable the plate 188 to be inserted through the interior of the mounting flange 174 until it seats on the edges 177. At this time, the projections 185 snap inward to lock the access plate 188 in the housing 172.

As shown in detail in FIGS. 25 and 26, an RJ telephone plug 181 is mounted in the aperture in the access control plate 188 by a snap-in connection, for example only. The RJ plug 181 is connected on the socket adapter side by wires to a telephone communication device, such as a modem, not shown. The opposite end of the RJ plug 181 is disposed within the hollow interior chamber of the coupler 160 and is positioned for receiving a mating plug on a conductor which can pass through an optional aperture 201 formed in the enlarge portion 220 of the cover 200 to provide telephone communication between the watthour meter and/or meter socket and an exterior telephone communication device or system.

Referring briefly to FIGS. 18 and 20, a seal or gasket 190 formed of a resilient material, for example, may be mounted on the end wall 178 of the housing 172. A channel can be formed in the gasket 190 to seat the gasket 190 over the edges 185 of the housing 172. The gasket 190 forms a seal between the housing 172 of the coupler 160 and the sidewall or shell 164 of the socket adapter 162 when the coupler 160 is fixedly mounted to the sidewall 164.

The coupler 160 also includes a cover 200, shown in FIGS. 14, 15, 18, and 21-23 which may be used to close an opening 202 formed in a lower flange 204 extending from an enlarged bottom wall 206 of the housing 172. Although the cover 200 can be releasably attached in a closed position to the housing 172 in a number of different ways, by example only, the cover 200 is depicted and described hereafter as a pivotal cover 200 which is snap connected or latched to the housing 172.

The cover 200 is formed of a moldable plastic, by example, as a one piece, unitary member. The cover 200 includes an enlarged housing 220 which projects from a further enlarged flange 222.

Figure 15:
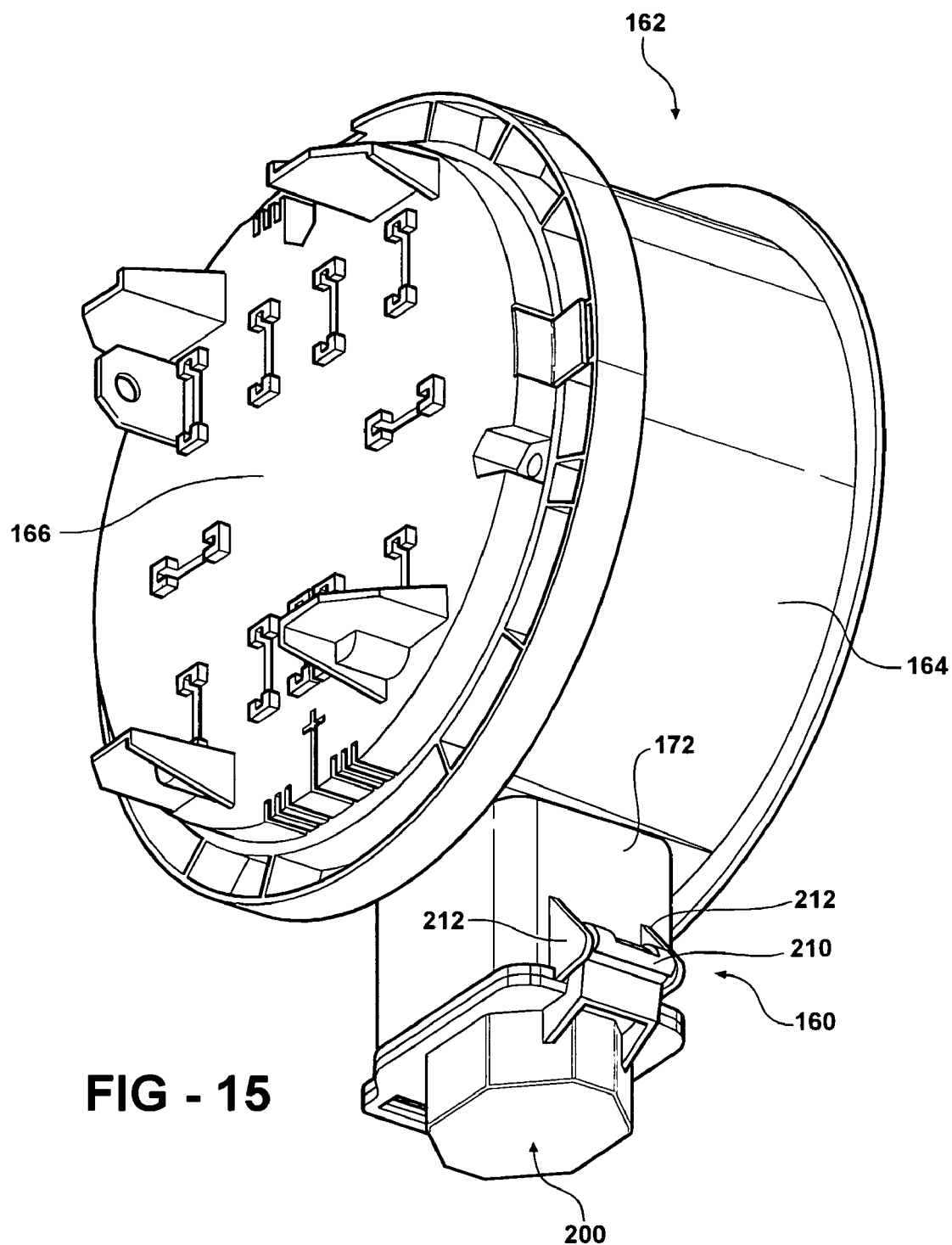
FIG. 15 is a bottom, rear perspective view of the power access shown in FIG. 14.

As shown in FIG. 15, a pivot or hinge pin 210 is spaced from the adjacent wall of the housing 172 by a pair of arms 212 integrally formed on and extending outward from the wall of the housing 172.

One end of the flange 222 on the cover 200 supports a hinge engagement member 224 extending from the flange 222 by one or more legs 226. The hinge engagement member 224 is shaped to pivotally receive the pivot pin 210 on the housing 172 as shown in FIG. 15.

The flange 222 of the cover 200 has a shape essentially the same as the shape as the bottom mounting wall 206 of the housing 172. In addition, the mounting flange 202 extending from the bottom wall 206 of the housing 172 is shaped complementary to the shape of the enlarged housing 220 on the cover 200 so as to seat within the walls of the enlarged housing 220 on the cover 200.

One end of the bottom wall 206 of the housing 172 has an outwardly extending end or flange 214 which includes one or more apertures 216.

One or more apertures 230 are formed in an end 229 of the flange 220 on the cover 200. Latch members or hooks 218 are integrally formed in the flange 222 and are movably disposed within the apertures 230. The ends of the hooks 218 are slidable through the apertures 216 in the end 214 of the housing 172 and snap over the flange 214 to releasably latch the cover 200 in a closed position on the housing 172 closing the open end in the housing 172.

The apertures 216 in the flange 214 of the housing 172 are sized only slightly larger than the hook shaped end portion of the hooks 218 thereby allowing the hooks 218 to pass through the apertures 216 with little clearance. After the hooks 218 snap-over the adjacent portion of the flange 214, as shown in FIG. 18, a security seal, such as a lead seal, 219, or other plastic/wire seal, may be inserted through one or both of the apertures 216. The presence of a portion of the seal 219 in one or both of the apertures 216 prevents the enlarged ends of the hooks 218 to pass through the apertures 216 thereby securely maintaining the cover 200 in a closed position on the coupler 160. Removal of the seal 219 is visual evidence of unauthorized opening of the cover 200.

Figure 22:
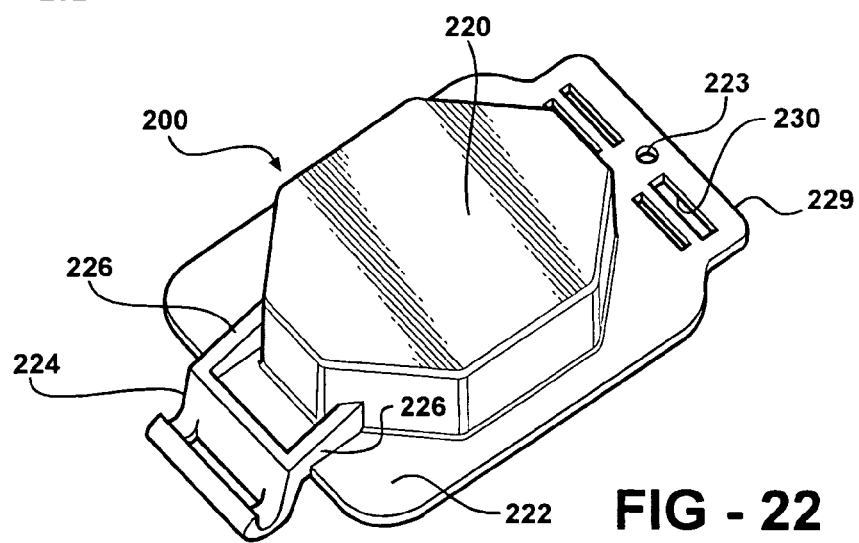
FIG. 22 is a perspective view of the coupler cover.

Alternately, as shown in FIGS. 18, 22 and 26, aligned apertures 221 and 223 in the flange 214 of the housing 172 and in the flange 229 of the cover 200, respectively, when the cover 200 is in the closed position on the coupler 160, can also receive a wire seal, such as seal 190.

A seal member or gasket 231 shown in FIG. 18 may be mounted on the outer surface of the wall 206 of the housing 172 or on the inner surface of the flange 222 of the cover 200 to seal the cover 200 to the wall 206 when the cover 200 is in the closed position over the aperture 202 in the housing 172.

It will be understood that the pivot cover 200 with snap-connections to the housings 172 may also be employed on the coupler 110 described above and shown in FIG. 1 to selectably close the open end of the coupler 110.

Another aspect of the present invention is shown in FIGS. 1 and 2. In this aspect, a Class 2 transformer 250 may be mounted on the bottom wall 34 of the socket adapter 30 within the sidewall or shell 44. The primary conductors 252 of the transformer 250 are shown connected to the line jaw contacts 102 in the socket adapter 32. The primary conductors 252 could likewise be connected to the load jaw contacts 102.

Secondary conductors 254 from the transformer 250 pass through the coupler 110, or the coupler 160 in the other aspect of the present invention, for connection to an external device, such as fiber optic power supply, cable television power supply, remote cellular satellite communication or any other device that needs electrical power. The use of the Class 2 transformer 250 enables the conductors 254 to exit the coupler 110 or 160 without requiring an external conduit.

The conductors 254 may also terminate in a plug which is mounted in one of the plates fixed within the coupler 110 or 160 for receiving terminal ends of external conductors extending into or out of the couplers 110 or 160.

Figure 27:
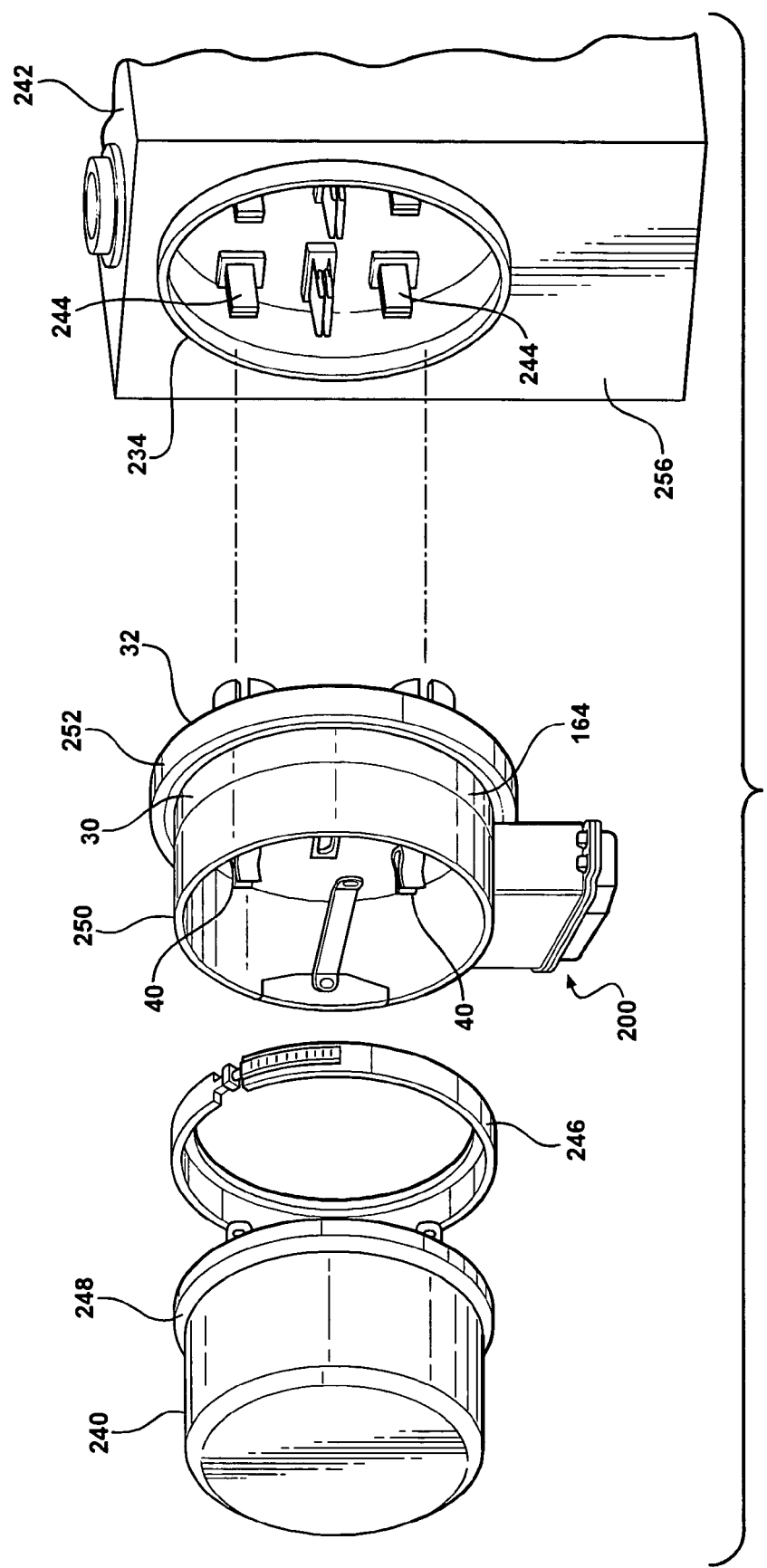
FIG. 27 is an exploded, perspective view showing the mounting of the electrical service entrance power access apparatus of the present invention in an electrical power service apparatus or socket.

Referring now to FIG. 27, there is depicted the electrical service power access apparatus 32 including the socket adapter 30 which receives a watthour meter 240 and is mountable in a meter socket 242. The blade terminal portions of the jaw blades 40 mounted in the socket adapter 30 are engagable with jaw contacts 244 in the socket 242. The jaw contact ends of the jaw blades 40 receive similar blade terminals on the watthour meter 240 to connect the watthour meter 240 through the adapter 30 to the jaw contacts 244 in the meter socket 242.

A sealing ring 246 is used to securely and lockably join a mounting flange or rim 248 on the watthour meter 240 to an outer mounting flange 250 on the socket adapter 30. A similar sealing ring, not shown, can be used to securely and lockably join a rearmost mounting flange 252 on the socket adapter 30 to a mounting flange 254 on a ring style meter socket cover 256.

In a ringless socket cover application, the rearmost mounting flange 252 of the socket adapter 30 is disposed within the interior of the socket 242 with the sidewall 164 extending exteriorly of the socket cover 256 so as to dispose the coupler 200 160 or 110 exteriorly of the socket 242.

It can be seen that in either the slide-in coupler 110 configuration or the snap-in coupler 160 configuration, either coupler 110 or 160 can be mounted in or removed from the socket adapter 30 or 162 after the socket adapter 30 or 162 is mounted in a "in service" position in the meter socket 242. This simplifies the installation, service or removal of the coupler 110 or 160 from the socket adapter as the socket adapter does not have to be removed from the meter socket 242 or disassembled, as required by prior art socket adapters having separately attachable couplers.

What is claimed is:

1. An electrical service entrance watthour meter socket adapter for coupling a watthour meter to a meter socket comprising:

a housing adapted for receiving a watthour meter, the housing having a wall;

a coupler;

complimentary surfaces, carried by the housing and the coupler, for slide-in attachment of the coupler of the housing without separate fasteners directly to the wall of the housing to establish a passage for external conductors to an interior of the housing, the surfaces defining the sole means for mounting the coupler to the housing; and the coupler being separable relative to the housing after the housing is mounted in an in-service position in a meter socket, only a watthour meter is removed from the housing.

2. The adapter of claim 1 wherein:

the coupler is releasibly fixed to the wall of the housing.

3. The adapter of claim 1 further comprising:

means for releasibly latching the coupler to the housing.

4. The adapter of claim 1 further comprising:

a discontinuity formed in the wall of the housing;

the coupler mounted in the discontinuity.

5. The adapter of claim 1 further comprising:

a plurality of ventilation apertures formed in the housing.

6. The adapter of claim 5 further comprising:

a plurality of ribs projecting inward from a sidewall of the housing; and the apertures disposed between adjacent ribs.

7. The adapter of claim 1 further comprising:

a cover member;

hinge means for pivotally coupling the cover to the coupler; and snap means, cooperatingly carried on the cover and the coupler, for releasibly connecting an opposite end of the cover to the coupler.

8. An electrical service entrance watthour meter socket adapter for coupling a watthour meter to a meter socket comprising:

a housing adapted for receiving a watthour meter, the housing having a wall;

a coupler releasibly mounted without separate fasteners on the wall of the housing to establish a passage for external conductors to an interior of the housing, the coupler separable relative to the housing after the housing is mounted in an in-service position in a meter socket and a watthour meter is removed from the housing; and a plurality of apertures formed in the housing, the apertures providing ventilation from an interior to an exterior of the housing.

9. The adapter of claim 8 further comprising:

a plurality of ribs projecting inward from a wall of the housing; and the apertures disposed between adjacent ribs.

10. An electrical service entrance watthour meter socket adapter for coupling a watthour meter to a meter socket comprising:

a housing adapted for receiving a watthour meter, the housing having a wall and;

a coupler connected without separate fasteners directly to the wall of the housing to establish a passage for external conductors to an interior of the housing, the coupler being separable relative to the housing after the housing is mounted in an in-service position in a meter socket, when a watthour meter is removed from the housing; and an access control plate carried in the coupler for controlling access through the coupler to the housing.

11. An electrical service entrance watthour meter socket adapter for coupling a watthour meter to a meter socket comprising:

a housing adapted for receiving a watthour meter, the housing having a wall and;

a coupler mounted without separate fasteners on the wall of the housing to establish a passage for external conductors to an interior of the housing, the coupler separable relative to the housing after the housing is mounted in an in-service position in a meter socket and a watthour meter is removed from the housing; and means for slide-in attachment of the coupler to the housing, the slide-in attachment means including;

a bead formed on one of the housing and the coupler;

a complementary groove formed on the other one of the housing and the coupler; and the bead slidable in the groove for slidably connecting the coupler to the housing.

12. An electrical service entrance watthour meter socket adapter for coupling a watthour meter to a watthour to a meter socket comprising:

a housing adapted for receiving a watthour meter, the housing, having a wall;

a coupler mounted without separate fasteners on the wall of the housing to establish a passage for external conductors to an interior of the housing, the coupler separable relative to the housing after the housing is mounted in an in-service position in a meter socket and a watthour meter is removed from the housing;

means for slide-in attachment of the coupler to the housing; and hook means, carried on one of the coupler and the housing and engagable with a complementary surface on the other of the coupler and the housing for releasably latching the coupler to the housing.

13. An electrical service entrance watthour meter socket adapter for coupling a watthour meter to a watthour to a meter socket comprising:

a housing adapted for receiving a watthour meter, the housing, having a wall;

a coupler mounted without separate fasteners on the wall of the housing to establish a passage for external conductors to an interior of the housing, the coupler separable relative to the housing after the housing is mounted in an in-service position in a meter socket and a watthour meter is removed from the housing;

means for slide-in attachment of the coupler to the housing; and a discontinuity formed in the sidewall of the housing;

the coupler mounted in the discontinuity;

the coupler having a rear edge;

a groove formed in one of the rear edge and the housing; and a projection formed on the other of the rear edge and the housing slidably engagable with the groove.

14. An electrical service entrance watthour meter socket adapter for coupling a watthour meter to a watthour to a meter socket comprising:

a housing adapted for receiving a watthour meter, the housing, having a wall;

a coupler mounted without separate fasteners on the wall of the housing to establish a passage for external conductors to an interior of the housing, the coupler separable relative to the housing after the housing is mounted in an in-service position in a meter socket and a watthour meter is removed from the housing;

means for slide-in attachment of the coupler to the housing;

the coupler including a body having an interior chamber opening to opposed ends of the body;

a cover; and means for mounting the cover over one end of the body to close the one end of the body to external access.

15. The adapter of claim 14 wherein the mounting means comprises:

a plurality of bores formed in the body of the coupler, the bores receiving fasteners extendable through the cover to attach the cover to the body.

16. The adapter of claim 14 further comprising:

an access control plate carried in the coupling for controlling access through the coupler to the housing.

17. An electrical service entrance watthour meter socket adapter for coupling a watthour meter to a meter socket comprising:

a housing adapted for receiving a watthour meter, the housing having a wall;

a coupler without separate fasteners on the wall of the housing to establish a passage for external conductors to an interior of the housing, the coupler separable relative to the housing after the housing is mounted in an in-service position in a meter socket and a watthour meter is removed from the housing; and complementary means, carried on the coupler and the housing, for connecting the coupler to the housing in a snap connection.

18. The adapter of claim 17 further comprising:

an access control plate mounted within the coupler for controlling access through the coupler to the socket adapter housing.

19. The adapter of claim 18 further comprising:

means for fixedly mounting the access plate in the coupler.

20. The adapter of claim 17 further comprising:

cover means for releasably closing an opening in one end of the coupler.

* * * * *